United States Patent
Wagoner et al.

(10) Patent No.: US 8,981,762 B2
(45) Date of Patent: Mar. 17, 2015

(54) APPARATUS AND METHOD FOR IMPROVED CURRENT SHUNT SENSING

(75) Inventors: Robert Gregory Wagoner, Roanoke, VA (US); Mark Eugene Shepard, Roanoke, VA (US)

(73) Assignee: General Electric Company, Schenectady, NY (US)

( * ) Notice: Subject to any disclaimer, the term of this patent is extended or adjusted under 35 U.S.C. 154(b) by 825 days.

(21) Appl. No.: 13/235,795

(22) Filed: Sep. 19, 2011

(65) Prior Publication Data

US 2013/0069632 A1 Mar. 21, 2013

(51) Int. Cl.
*G01R 1/20* (2006.01)

(52) U.S. Cl.
CPC ....................................... *G01R 1/203* (2013.01)
USPC ............................................ 324/126; 338/49

(58) Field of Classification Search
None
See application file for complete search history.

(56) References Cited

U.S. PATENT DOCUMENTS

| | | | |
|---|---|---|---|
| 4,743,875 A | 5/1988 | Murphy | |
| 5,300,917 A | 4/1994 | Maue et al. | |
| 6,351,115 B1 | 2/2002 | Kasunich | |
| 7,135,891 B2 | 11/2006 | Grasso et al. | |
| 2009/0039836 A1* | 2/2009 | Asada | 320/152 |

FOREIGN PATENT DOCUMENTS

WO    WO 00/08476    2/2000

* cited by examiner

*Primary Examiner* — Melissa Koval
*Assistant Examiner* — Stephen G Armstrong
(74) *Attorney, Agent, or Firm* — Dority & Manning, P.A.

(57) ABSTRACT

An apparatus and method for improved current shunt sensing in an electrical system, such as a renewable energy electrical system, is disclosed. A current shunt according to aspects of the present disclosure includes a conductive portion that is placed in series with an electrical system The current shunt includes a sensing element that is used to measure the voltage across the conductive portion of the current shunt. The sensing element has an increased width relative to the width of the conductive portion of the shunt. The increased width of the sensing element provides for improved current shunt sensing that results in more accurate voltage (and thus current) measurements across a wide range of frequencies.

18 Claims, 3 Drawing Sheets

APPARATUS AND METHOD FOR IMPROVED CURRENT SHUNT SENSING

FIELD OF THE INVENTION

The present disclosure relates generally to a current shunt for measuring current in an electrical system, such as in a renewable energy electrical distribution system. The present disclosure more particularly relates to an apparatus and method for improved current shunt sensing across a wide range of frequencies.

BACKGROUND OF THE INVENTION

Current shunts have been used to measure high currents in electrical systems, such as solar power electrical systems and wind power electrical systems. A typical current shunt includes the electrical equivalent of a low value resistor placed in series with an electrical system so that all of the current to be measured flows through the current shunt. The shunt resistance is typically as low as possible so that use of the current shunt does not affect or change circuit characteristics. The voltage drop across the current shunt is measured to determine the current flowing through the shunt.

Many current shunts are rectangular in shape with separate current connections and voltage sensing connections. A sensing element that is narrow in width relative to the current shunt is often coupled between the voltage sensing connections for measuring the voltage across the current shunt. A typical sensing element may include a narrow wire/conductor or circuit card trace that is coupled to a voltage measurement device for measuring the voltage across the current shunt.

For example, FIG. 1 illustrates an exemplary known current shunt 100 for high current applications. The current shunt 100 includes high current terminals 110 that can be coupled in series with a load through terminal connections 112. Current shunt 100 includes a shunt portion 120 having a resistance that is known to a high degree of accuracy. Current shunt 100 further includes a pair of separate sensing terminals 125 to measure the voltage across the current shunt 100. A sensing element 130 that comprises a narrow trace disposed on a circuit card 135 is coupled between sensing terminals 125. Sensing element 130 is coupled to a plug connection 140 for coupling to a suitable voltage measurement device. As shown in FIG. 1, sensing element 130 has a width that is narrow relative to the current shunt 100.

At low frequencies, the sensing voltage measured by a narrow sensing element, such as a narrow wire/conductor or narrow trace on a circuit card, is dependent on the current flowing through the current shunt. However, at higher frequencies, eddy currents caused by the skin effect can result in a non-uniform distribution of the current flow across the current shunt. More particularly, as the frequency of the current flowing through the current shunt increases, a greater portion of the current flows through the edges of the current shunt than at the middle or center of the current shunt. This causes the voltage drop across the edges of the current shunt to be different than the voltage drop across the center of the current shunt.

A narrow sensing element, such as a wire/conductor or narrow trace, typically only accounts for a voltage drop across a portion of the current shunt. For instance, the narrow sensing element 130 depicted in FIG. 1 will measure a voltage drop primarily attributable to current flowing through the middle of the current shunt 100. Because the current distribution across the current shunt 100 will vary at higher frequencies, measurements made by a narrow sensing element, such as narrow sensing element 130, may be inaccurate.

Thus, a need exists for an apparatus and method for improved current shunt sensing that results in more accurate sensing across a wider range of frequencies.

BRIEF DESCRIPTION OF THE INVENTION

Aspects and advantages of the invention will be set forth in part in the following description, or may be obvious from the description, or may be learned through practice of the invention.

One exemplary aspect of the present disclosure is directed to a current shunt. The current shunt includes a conductive portion having an upper surface defining a width and a sensing element overlying the upper surface of the conductive portion. The sensing element overlies at least a part of the conductive portion and has a width in the range of about 20% to about 100% of the width of the conductive portion.

Another exemplary aspect of the present disclosure is directed to a current shunt for measuring current in an electrical system. The current shunt includes a pair of current terminals couplable in series with the electrical system and a conductive shunt portion between the current terminals having an upper surface defining a surface area. The current shunt further includes a pair of sensing terminals and a circuit card mechanically coupled to the pair of sensing terminals. The circuit card includes a conductive trace having a surface area that overlies between about 20% to about 100% of the surface area of the conductive shunt portion.

A further exemplary aspect of the present disclosure is directed to a method. The method includes providing a current shunt comprising a conductive portion having an upper surface defining a width; sizing a sensing element used to measure voltage across the conductive portion of the current shunt to have a width in the range of about 20% to about 100% of the width of the conductive portion of the current shunt; and, placing the sensing element over at least a portion of the upper surface of the conductive portion of the current shunt.

Variations and modifications can be made to these exemplary aspects of the present disclosure.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

DETAILED DESCRIPTION OF THE INVENTION

Figure 1:
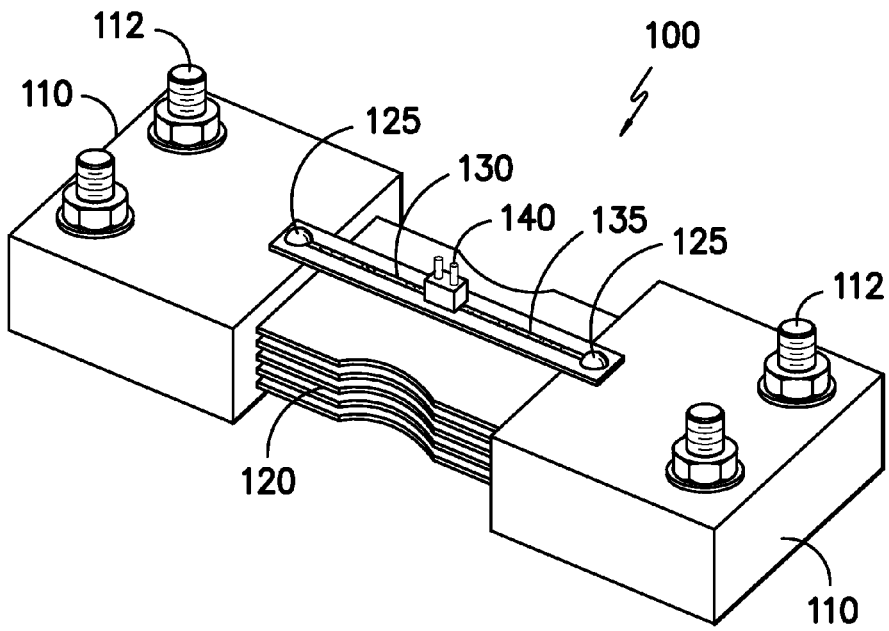
FIG. 1 provides a perspective view of an exemplary current shunt known in the prior art.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Generally, the present disclosure is directed to an improved apparatus and method for current shunt sensing. A current shunt according to the present disclosure includes a conductive portion that is placed in series with an electrical system. The current shunt includes a sensing element that is used to measure the voltage across the conductive portion of the current shunt.

It has been discovered that the capability of a sensing element to accurately measure the voltage across the conductive portion of the current shunt (and thus the current flowing through the current shunt) at higher frequency currents increases as the width of the sensing element approaches the width of the conductive portion of the current shunt. Without being bound to any particular theory of operation, it is believed that the increased accuracy of the sensing element is attributable to an increase in the coupling coefficient between the sensing element and the conductive portion of the shunt as the width of the sensing element approaches the width of the conductive portion of the shunt.

Accordingly, a particular aspect of the present disclosure is directed to a current shunt having a sensing element with an increased width relative to the width of the conductive portion of the shunt. For instance, in a particular embodiment the width of the sensing element is within about 20% to about 100% of the width of the conductive portion of the current shunt, such as within about 40% to about 100% of the current shunt, such as within about within about 80% to about 100% of the current shunt, and all other sub-ranges therebetween. In this manner, the subject matter of the present disclosure provides for improved current shunt sensing that results in more accurate voltage (and thus current) measurements across a wide range of frequencies.

Figure 2:
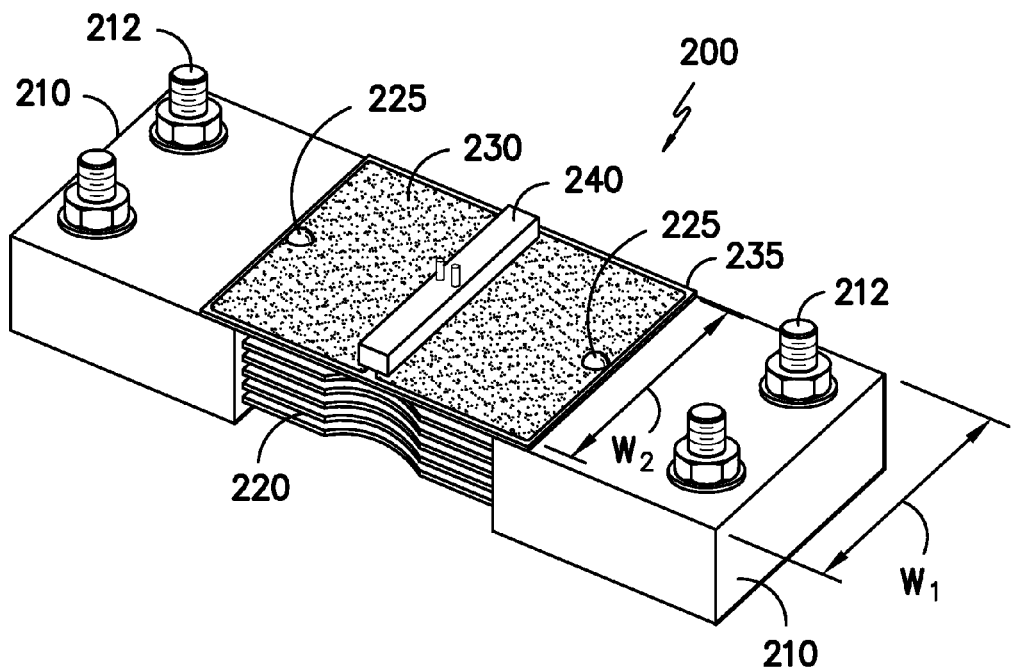
FIG. 2 provides a perspective view of an exemplary current shunt according to an exemplary embodiment of the present disclosure.

FIG. 2 illustrates a current shunt 200 according to an exemplary embodiment of the present disclosure. Current shunt 200 includes a pair of high current terminals 210. Current terminals 210 are adapted to he placed in series with an electrical system such that current flows through the current shunt 200. Current terminals 210 can be secured or mechanically coupled to the electrical system through one or more terminal connections 212, such as a nut/bolt connection or other suitable connection.

Current terminals 210 are composed of a conductive material and can have a resistance that is known to a high degree of accuracy. In a particular embodiment, current terminals 210 can be rated for higher currents, such as up to about 1000 A. Those of ordinary skill in the art, using the disclosures provided herein, should understand that the present disclosure is not limited to a current shunt of any particular current rating.

Current shunt 200 includes a conductive shunt portion 220 coupled between current terminals 210. Conductive shunt portion 220 can include one or more conductive plates disposed between current terminals 210. Conductive shunt portion 220 is composed of a conductive material having a resistance known to a high degree of accuracy. When the current shunt 200 is coupled to an electrical system, current flows through the conductive shunt portion 220 causing a small voltage drop across the known resistance of the conductive shunt portion 220. This voltage drop can be measured and correlated to a current using the known resistance of the conductive shunt portion 220 to provide a current measurement of the current flowing through the current shunt 200.

The current shunt 200 includes a pair of sensing terminals 225 and a sensing element 230 disposed between the sensing terminals 225. The sensing element 230 is used to measure the voltage drop across the conductive shunt portion 220. According to a particular aspect of the present disclosure, the sensing element 230 includes a conductor/wire having a width $W_2$ that approaches the width $W_1$ of the current shunt. As will be discussed in detail below, this increases the coupling coefficient between the conductive shunt portion 220 and the sensing element 230, leading to improved voltage measurements across the conductive shunt portion 220 across a wide range of frequencies.

The sensing element depicted in FIG. 2 includes a conductive trace that is located on a circuit card 235 mechanically connected to sensing terminals 225. The circuit card 235 is coupled to the sensing terminals 225 such that the sensing element 230 overlies the conductive shunt portion 220, in a particular embodiment, the vertical spacing between the circuit card 235 and the upper surface of the conductive shunt portion 220 is between about 1.5 mm and about 4.5 mm. A plug connection 240 is provided so that the sensing element 230 is couplable to a voltage measurement device.

As shown in FIG. 2, the sensing element 230 has a surface area that approaches the surface area of the upper surface of the conductive shunt portion 220 and a width $W_2$ that approaches the width $W_1$ of the current shunt 200. In this manner, the sensing element 230 is able to capture fields generated by any increased current flow at the edges of the current shunt 200 at high frequencies, providing for improved current measurements by the current shunt 200.

Simulations were performed for a current shunt constructed similarly to the current shunt 200 depicted in FIG. 2. The width of the current shunt was about 110 mm. The width of the sensing element was varied from between about 2 mm to about 100 mm. The spacing between the sensing element and the conductive shunt was about 3 mm. Table 1 below shows the complex impedance matrix for the conductive shunt portion and the sensing element using an Ansoft Maxwell Eddy Current Solver at 100 KHz.

TABLE 1

| Sensing Element Width | R, L Conductive Shunt Portion (ohm, nH) | R, L Sensing Element (ohm, nH) | R, L Mutual (ohm, nH) |
| --- | --- | --- | --- |
| 2 mm | 1.4216e−5, 18.586 | 0.0053679, 101.75 | 7.3489e−6, 16.837 |
| 4 mm | 1.5172e−5, 18.561 | 0.0027366, 77.157 | 7.8493e−6, 16.844 |
| 8 mm | 1.8585e−5, 18.490 | 0.0014957, 53.237 | 9.3776e−6, 16.847 |
| 16 mm | 1.7996e−5, 18.502 | 0.00077659, 38.020 | 9.1316e−6, 16.842 |
| 32 mm | 1.7622e−5, 18.502 | 0.00039533, 28.195 | 8.8194e−6, 16.839 |
| 100 mm | 1.7637e−5, 18.504 | 0.00013226, 19.652 | 8.4617e−6, 16.704 |

The following Table 2 shows the inductive coupling coefficients between the sensing element and the conductive shunt portion at 100 KHz. These values are independent of current flowing through the current shunt.

TABLE 2

| Sensing Element Width | Coupling Coef Conductive Shunt Portion | Coupling Coef Sensing Element | Coupling Coef Mutual |
|---|---|---|---|
| 2 mm | 1 | 1 | 0.38717 |
| 4 mm | 1 | 1 | 0.44510 |
| 8 mm | 1 | 1 | 0.53697 |
| 16 mm | 1 | 1 | 0.63502 |
| 32 mm | 1 | 1 | 0.73727 |
| 100 mm | 1 | 1 | 0.87595 |

Figure 3:
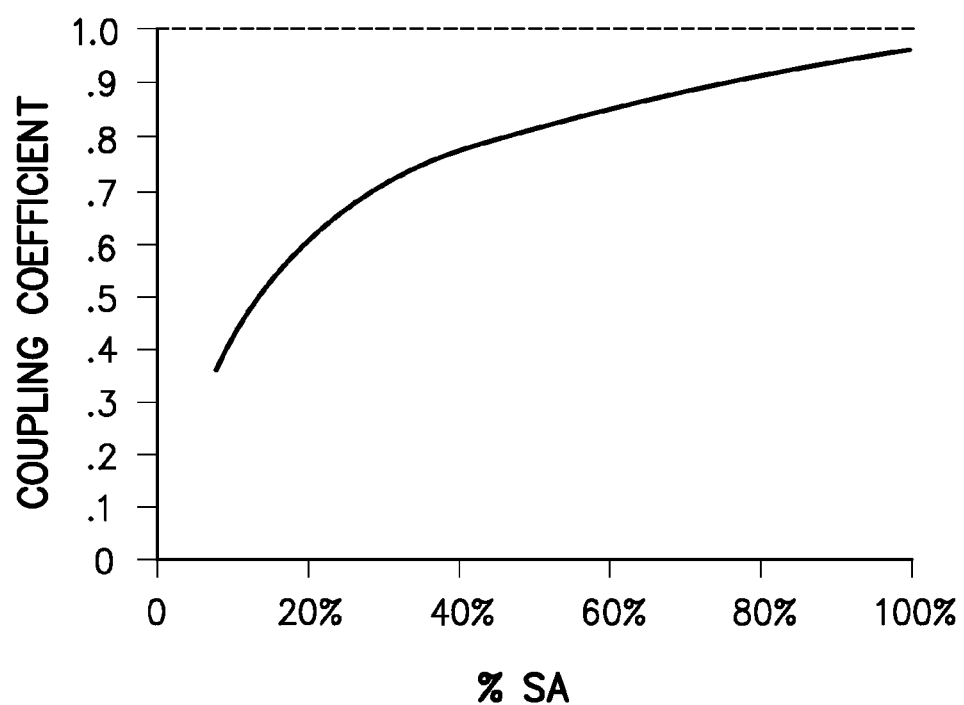
FIG. 3 provides a graphical representation of simulation data for sensing elements of varying widths according to an exemplary aspect of the present disclosure.

As shown by Table 2, the coupling coefficient between the sensing element and the conductive shunt portion increases as the width of the sensing element approaches the width of the current shunt. These results are graphically depicted in FIG. 3. Curve 305 shows that that coupling coefficient between the conductive shunt portion and the sensing element falls within a range of about 0.6 to about 1.0 when the sensing element overlies about 20% to about 100% of the upper surface of the conductive shunt portion. The coupling coefficient falls within a range of about 0.7 to about 1.0 when the sensing element overlies about 40% to about 100% of the upper surface of the conductive shunt portion. In this regard, a 20% increase in surface area coverage from about 20% to about 40% results in about a 10% increase in the coupling coefficient between the sensing element and the conductive shunt portion.

The increase in coupling coefficient allows the sensing element to better capture the fields generated by the current flowing through the current shunt, even at higher frequencies where more current flows at the edges of the current shunt. In this manner, the apparatus and method according to aspects of the present disclosure provide for an improved current shunt sensing across a wide range of frequencies.

Figure 4:
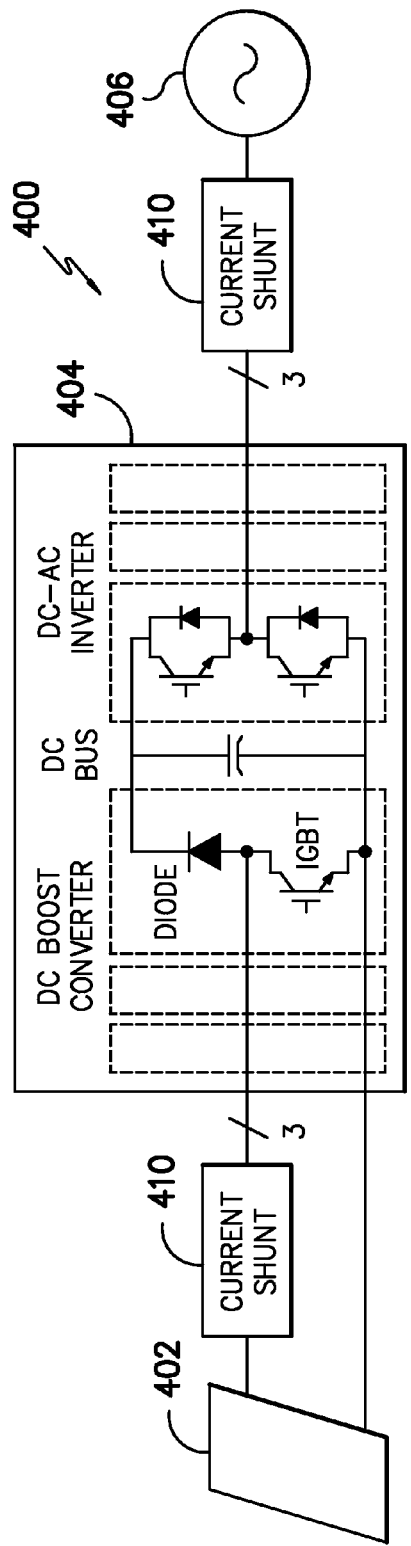
FIG. 4 is a block diagram of an exemplary solar power electrical system.

The current shunt according to embodiments of the present disclosure can be used in association with a renewable energy source, such as a solar power electrical system or a wind power electrical system. FIG. 4 illustrates an exemplary solar power distribution system 400. Solar power distribution system 400 includes a PV array 402 that supplies power to the electrical grid 406 through solar power converter 404. Solar power converter 404 converts DC power generated by PV array 402 into AC power suitable for use with the electrical grid 406. The solar power converter 404 illustrated in FIG. 4 is a two-stage solar power converter that includes a DC boost converter coupled to a DC-AC inverter through a DC bus. One or more current shunts 410 can be coupled in series with PV array 402 and solar power converter 404 to monitor current flowing from PV array 402 into solar power converter 404. One or more current shunts 410 can be coupled in series with the solar power converter 404 and the electrical grid 406 to monitor current flowing from the solar power converter 404 to the electrical grid 406.

Figure 5:
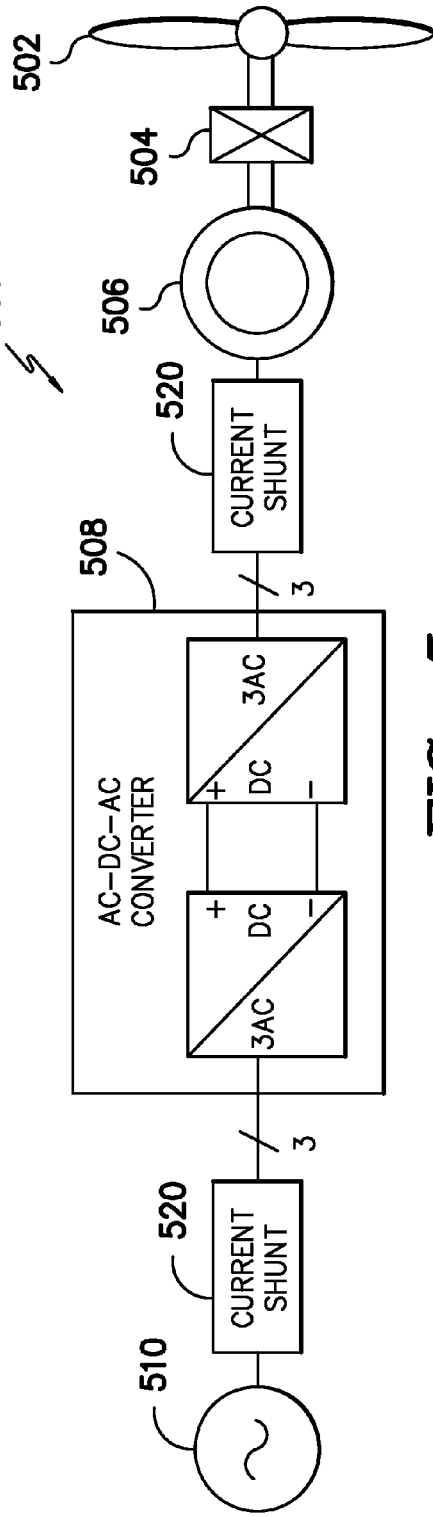
FIG. 5 is a block diagram of an exemplary wind power electrical system.

FIG. 5 illustrates an exemplary wind power electrical system 500. During operation, wind impacts the blades 502 and blades 502 transform wind energy into a mechanical rotational torque that rotatably drives a low-speed shaft. The low-speed shaft drives gearbox 504 that subsequently steps up the low rotational speed of low-speed shaft to drive a high-speed shaft at an increased rotational speed. The high speed shaft rotatably drives the rotor of generator 506. A rotating magnetic field is induced by the rotor of generator 506 and a voltage is induced within the stator of generator 506. In this manner, generator 506 converts the rotational mechanical energy to a sinusoidal, three-phase alternating current (AC) electrical energy signal. The associated electrical power is provided to an AC-DC-AC converter 508, which is used to supply power to an electrical grid 510. One or more current shunts 520 can be coupled in series with generator 506 and AC-DC-AC converter 508 to monitor current flowing from generator 506 to AC-DC-AC converter 508. One or more current shunts 520 can also be coupled in series with the AC-DC-AC converter 508 and the electrical grid 510 to monitor current flowing from the AC-DC-AC converter 508 to the electrical grid 510.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A current shunt, comprising:
   a conductive portion comprising a plurality of conductive platesdisposed between two current terminals, wherein the conductive portion has an upper surface defining a width; and,
   a sensing element overlying the upper surface of said conductive portion;
   wherein said sensing element has a surface area overlying 100% of the surface area of said conductive portion such that the coupling coefficient between the sensing element and the conductive portion is increased at high frequencies where increased current flows at the edges of the current shunt.

2. The current shunt of claim 1, wherein said sensing element has a width of 100% of the width of said conductive portion.

3. The current shunt of claim 1, wherein said current shunt comprises a pair of sensing terminals, said sensing element coupled between said pair of sensing terminals.

4. The current shunt of claim 1, wherein said sensing element comprises a wide conductor disposed adjacent the upper surface of said conductive portion.

5. The current shunt of claim 3, wherein said sensing element is disposed on a circuit card mechanically connected to said pair of sensing terminals.

6. The current shunt of claim 5, wherein said sensing element comprises a conductive trace located on said circuit card.

7. The current shunt of claim 6, wherein said conductive trace is coupled to a plug connection couplable to a voltage measurement device.

8. The current shunt of claim 1, wherein the coupling coefficient between said conductive portion and said sensing element is in the range of 0.7 to 1.0.

9. A current shunt for measuring current in a renewable energy electrical system, comprising:
   a pair of current terminals couplable in series with the electrical system;

a conductive shunt portion comprising a plurality of conductive plates between the current terminals having an upper surface defining a surface area;

a pair of sensing terminals; and, a circuit card mechanically coupled to said pair of sensing terminals;

wherein said circuit card comprises a conductive trace having a surface area overlying 100% of the surface area of said conductive shunt portion such that the coupling coefficient between the conductive shunt portion and the sensing element is increased at high frequencies where increased current flows at the edges of the current shunt.

10. The current shunt of claim 9, wherein said conductive trace has a surface area of 100% of the surface area of said conductive shunt portion.

11. The current shunt of claim 9, wherein the vertical spacing between said conductive trace and the upper surface of said conductive shunt portion is in the range of 1.5 mm to 4.5 mm.

12. The current shunt of claim 9, wherein the coupling coefficient between said conductive trace and said conductive shunt portion is in the range of 0.7 to 1.0.

13. The current shunt of claim 9, said current shunt further comprising a plug connection coupled to said conductive trace, said plug connection couplable to a voltage measurement device.

14. A method, comprising:

providing a current shunt comprising a conductive portion comprising a plurality of conductive plates having an upper surface defining a width;

sizing a sensing element used to measure voltage across the conductive portion of the current shunt to have a surface area that overlies 100% of the surface are of the conductive portion of the current shunt; and, placing the sensing element over the entire upper surface of the conductive portion of the current shunt such that the coupling coefficient between the conductive portion and the sending element is increased at high frequencies where increased current flows at the edges of the current shunt.

15. The method of claim 14, wherein the sensing element has a width of 100% of the width of the conductive portion.

16. The method claim 14, wherein the sensing element comprises a conductive trace disposed on a circuit card.

17. The method of claim 14, wherein the coupling coefficient between the conductive portion and the sensing element is in the range of 0.7 to 1.0.

18. The method of claim 14, wherein the vertical spacing between the sensing element and the upper surface of the conductive portion is in the range of 1.5 mm to 4.5 mm.

* * * * *